000
(12) United States Patent
Kaneko

(10) Patent No.: US 7,642,868 B2
(45) Date of Patent: Jan. 5, 2010

(54) WIDE RANGE INTERPOLATIVE VOLTAGE CONTROLLED OSCILLATOR

(75) Inventor: Masaaki Kaneko, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 11/763,997

(22) Filed: Jun. 15, 2007

(65) Prior Publication Data

US 2008/0309416 A1 Dec. 18, 2008

(51) Int. Cl.
*H03B 27/00* (2006.01)
(52) U.S. Cl. ............. 331/57; 331/177 R; 331/185
(58) Field of Classification Search ............ 331/175, 331/185, 186, 57, 34, 45, 50, 55, 177 R
See application file for complete search history.

(56) References Cited

U.S. PATENT DOCUMENTS

| 6,353,369 | B1 | 3/2002 | Boerstler | |
|---|---|---|---|---|
| 6,504,439 | B1 * | 1/2003 | Ozawa et al. | 331/57 |
| 6,529,084 | B1 | 3/2003 | Boerstler | |
| 6,559,727 | B2 * | 5/2003 | Boerstler | 331/57 |
| 6,744,326 | B2 | 6/2004 | Boerstler | |
| 6,963,250 | B2 * | 11/2005 | Ngo et al. | 331/57 |
| 7,009,457 | B2 * | 3/2006 | Kim | 331/57 |
| 7,391,277 | B2 * | 6/2008 | Boerstler et al. | 331/57 |

* cited by examiner

*Primary Examiner*—Rexford N Barnie
*Assistant Examiner*—Christopher Lo
(74) *Attorney, Agent, or Firm*—Law Offices of Mark L. Berrier

(57) ABSTRACT

Systems and methods for increasing the frequency range of an output signal generated by a VCO, where one or more variable delay units are incorporated into an interpolative VCO to decrease the minimum frequency at which the VCO oscillates. In one embodiment, the VCO includes a ring of serially connected inverters, a set of bypass circuits and a set of variable delay units. The bypass circuits are coupled to the ring of serially connected inverters to bypass one or more of the serially connected inverters when enabled. Each variable delay unit delays signal transitions at the input of a corresponding one of the serially connected inverters by a variable amount. The variable delay units may be positioned in series with the ring of inverters, in parallel with the bypass paths, or in parallel with corresponding inverters in the ring of inverters.

16 Claims, 7 Drawing Sheets

| VC (volts) | VCO frequency (GHz) | | | |
|---|---|---|---|---|
| | Fig. 1 | Fig. 2 | Fig. 4 | Fig. 5 |
| 0 | 6.62 | 2.65 | 1.92 | 1.77 |
| 0.1 | 6.62 | 2.65 | 2.12 | 1.98 |
| 0.2 | 6.71 | 2.67 | 2.44 | 2.31 |
| 0.3 | 6.99 | 2.85 | 3.13 | 3.04 |
| 0.4 | 7.81 | 3.34 | 4.39 | 4.37 |
| 0.5 | 9.17 | 4.22 | 6.13 | 6.20 |
| 0.6 | 10.75 | 5.38 | 8.20 | 8.23 |
| 0.7 | 12.35 | 6.67 | 9.90 | 9.80 |
| 0.8 | 13.89 | 8.26 | 11.24 | 11.09 |
| 0.9 | 15.15 | 10.42 | 12.35 | 12.23 |
| 1 | 16.13 | 12.50 | 13.16 | 13.13 |
| max/min | 2.44 | 4.72 | 6.85 | 7.42 |

Fig. 6

WIDE RANGE INTERPOLATIVE VOLTAGE CONTROLLED OSCILLATOR

BACKGROUND

1. Field of the Invention

The invention relates generally to voltage controlled oscillators, and more particularly to systems and methods for increasing the frequency ranges achievable by interpolative voltage controlled oscillators.

2. Related Art

Data processing and communication systems often rely on timing signals to enable their operation. For example, clock signals may be used to interpret binary signals as series of ones and zeros, to synchronize the propagation of data through logic circuits, and so on. Clock signals are typically generated by phase locked loop (PLL) circuitry which makes use of voltage controlled oscillators (VCO's). VCO's are devices which produce oscillating signals, where the frequencies of oscillation are dependent upon control voltages which are input to the VCO's.

VCO's are typically constructed using a circularly connected series of inverters. The output of each inverter serves as the input to the next inverter in the series, with the output from the last inverter being routed back to the input of the first inverter. The series includes an odd number of inverters, so that a signal which is initially input to one of the inverters is inverter and odd number of times before being returned to the input of that inverter. Thus, when a high signal propagates through the series of inverters and returns to its starting point, the signal is low, causing a transition which then propagates through the inverters. This process repeats itself, causing the signal at each point in the loop to repeatedly transition between high and low values.

In a simple VCO, the frequency at which the signal oscillates is dependent upon the voltage (the control voltage) which is supplied to the inverters. The higher the voltage, the more quickly the inverters will transition between high and low values, resulting in higher frequencies of oscillation. The lower the voltage which is supplied to the inverters, the more slowly the inverters will transition, resulting in lower frequencies of oscillation. Thus, the lowest frequency which will be generated by the VCO corresponds to the lowest control voltage (e.g., 0,) while the highest frequency corresponds to the highest control voltage (e.g., Vdd, or the power supply voltage.)

In order to increase the frequency of the signal that can be generated by a VCO, interpolative VCO's have been developed. In an interpolative VCO, a series of inverters are circularly connected as described above, but additional circuitry is provided to forward the oscillating signal in the loop, essentially shortening the loop of inverters. Because there are effectively fewer inverters in the loop, the frequency of oscillation increases. The forwarding circuitry between two modes of the loop may be as an inverter and a transistor connected in series. When it is desired to increase the frequency of oscillation, the transistor is switched on in order to forward the signal. When the transistor is switched off, the series of inverters operates in the same manner as the simple VCO described above. While such interpolative VCO's are beneficial in that they enable the generation of higher-frequency signals by effectively shortening the loops of inverters, it would be desirable to provide VCO's which are capable of generating an even wider range of frequencies.

SUMMARY OF THE INVENTION

One or more of the problems outlined above may be solved by the various embodiments of the invention. Broadly speaking, the invention includes systems and methods for increasing the frequency range of an output signal generated by a VCO, where one or more variable delay units are incorporated into an interpolative VCO to decrease the minimum frequency at which the VCO oscillates. In one embodiment, the VCO includes a ring of serially connected inverters, a set of bypass circuits and a set of variable delay units. The bypass circuits are coupled to the ring of serially connected inverters, with each bypass circuit bypassing one or more of the serially connected inverters when the bypass circuit is enabled. Each variable delay unit is configured to delay, by a variable amount, signal transitions at the input of a corresponding one of the serially connected inverters.

In one embodiment, each variable delay unit is positioned between a successive pair of the serially connected inverters, and is configured to provide a variable conductance between the successive pair of the serially connected inverters. The variable delay unit may include a first (e.g., low-impedance) transistor and a delay component coupled in parallel between the input and the output of the variable delay unit. The delay component may be a second (e.g., high-impedance) transistor. A control voltage VC can be applied to the gate of the first transistor, while a bias voltage VB is applied to the gate of the second transistor. A bias voltage generator may be provided to generate a selectable bias voltage. The bias voltage generator may, for example, include a multiplexer, into which a plurality of different voltages are input. A bias control signal can be applied to the control input of the multiplexer to select one of the input voltages to be output as the bias voltage.

In another embodiment, each variable delay unit is coupled to the ring of serially connected inverters in parallel with a corresponding one of the bypass circuits. The variable delay unit has a gain which is opposite a gain of the corresponding bypass circuit. The bypass path and the variable delay unit are inversely controlled, i.e., when one is enabled the other is disabled, and they may be enabled/disabled to varying degrees. In one embodiment, the bypass path includes an inverter in series with an NMOS transistor, and the variable delay unit includes a buffer in series with a PMOS transistor. Both transistors are controlled by the same voltage (VC) which controls the outer ring of inverters.

In another embodiment, each variable delay unit is coupled in parallel to one of the serially connected inverters (i.e., the inputs, as well as the outputs, of the inverter and variable delay unit are coupled to each other.) The variable delay unit is configured to delay the received signal by an amount greater than the amount by which the signal is delayed by the inverter. The variable delay unit is enabled when the control voltage (VC) is low to increase the effective length of the signal path through the ring. The variable delay unit may, for instance, include several inverters which are serially connected between the input and output of the variable delay unit. A transistor may be connected in series with these inverters to enable the variable delay unit.

Numerous additional embodiments are also possible.

BRIEF DESCRIPTION OF THE DRAWINGS

Other objects and advantages of the invention may become apparent upon reading the following detailed description and upon reference to the accompanying drawings.

FIG. 6 is a table showing the oscillation frequency of each of the described VCO structures as a function of the control voltage, VC.

Figure 1:
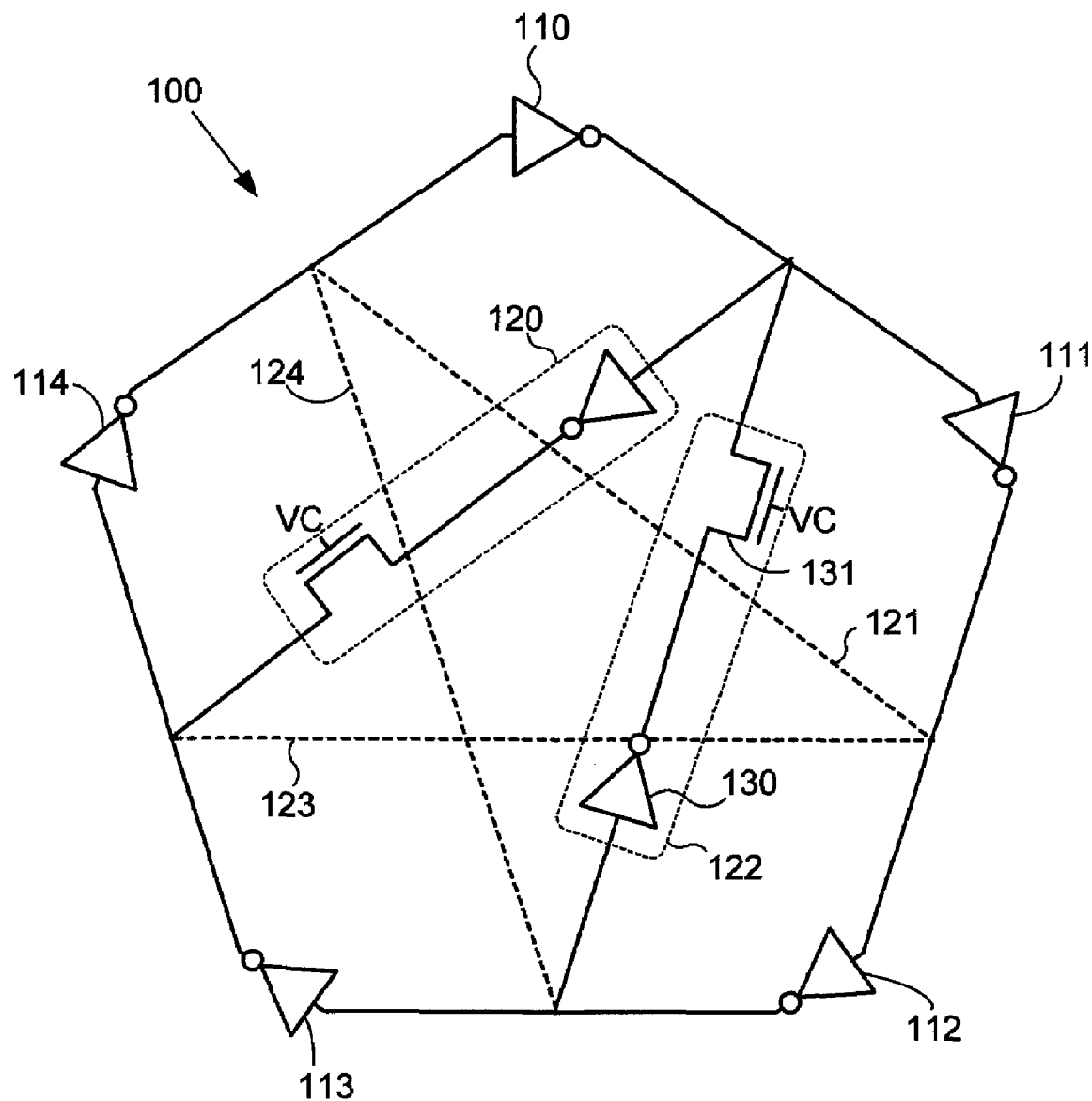
FIG. 1 is a diagram illustrating the structure of a conventional VCO in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for increasing the frequency range of an output signal generated by a VCO, where one or more variable delay units are incorporated into an interpolative VCO to decrease the minimum frequency at which the VCO oscillates.

In one embodiment, the variable delay units are incorporated into a conventional VCO structure. This structure includes a series of inverters that are connected end-to-end to form an outer ring. There are an odd number of inverters so that a signal which is input to one of the inverters will propagate through the ring, being inverted an odd number of times before returning to the point at which it was input to the first inverter. The signal at the starting point will therefore transition from high to low (or vice versa) every time it traverses the ring, resulting in a frequency of oscillation which is half of this rate (since there is one high-to-low transition and one low-to-high transition in each oscillation.) The rate at which the signal transitions propagate through the ring of inverters (hence the frequency) is dependent upon a control voltage (VC) which is applied to the inverters.

The VCO also includes a set of bypass paths (circuits) which can be selectively enabled to effectively shorten the signal path through the ring of inverters. In this embodiment, each bypass path consists of an inverter in series with a transistor. Each bypass path originates at the output of one of the inverters in the outer ring and terminates at the input of a subsequent inverter in the ring, thereby bypassing some larger number of inverters in the ring. For instance, if there are five inverters in the outer ring, the bypass path may skip three of the inverters of the outer ring, effectively replacing the three skipped inverters with the inverter of the bypass path. This shortens the time required for successive signal transitions to occur, increasing the frequency of oscillation. The transistor is controlled by VC so that the bypass path is enabled when a higher frequency is desired (VC is high,) and disabled when a lower frequency is desired (VC is low.)

The VCO also includes a set of variable delay units which are positioned between the inverters of the outer ring and can be selectively enabled to slow down the rate at which the signal transitions propagate from one inverter to the next in the outer ring. In this embodiment, each variable delay unit consists of two transistors that are connected in parallel between successive inverters in the ring. The first transistor is a low-impedance NMOS transistor. This transistor is controlled by VC, so that when VC is high, the other transistors bypassed and the signal propagating through the variable delay unit is not slowed. This keeps the variable delay unit from significantly decreasing the maximum VCO output frequency. When VC is low, the conductance of this low-impedance transistor drops, forcing current to flow through the second transistor. The second transistor is a high-impedance transistor which is controlled by a bias voltage (VB.) The conductance of the transistor is dependent on the magnitude of VB. The lower VB, the lower the conductance of the transistor, and the lower the resulting VCO frequency (when VC is also low.)

Before describing the various exemplary embodiments of the invention, it will be helpful to review the structure of conventional VCO's. Referring to FIG. 1, a diagram illustrating the structure of a conventional VCO in accordance with the prior art is shown. It can be seen that the VCO includes a series of inverters configured in an outer ring, as well as a set of bypass paths (circuits) which interconnect nodes across the ring. These bypass paths, when enabled, form smaller, inner loops among the inverters.

The outer ring of VCO 100 consists of five inverters, 110-114. Inverters 110-114 are connected end-to-end, so that a signal which is input to one of the inverters will be continually circulated through the ring. The VCO also includes five bypass paths, 120-124, each of which is connected between two of the nodes in the ring. ("Node" is used here to refer to a connection between successive inverters in the outer ring.) It should be noted that, for purposes of clarity, FIG. 1 only depicts the individual components of bypass paths 120 and 122. Bypass paths 121, 123 and 124 are depicted as dotted lines, but it should be understood that these bypass paths are configured identically to paths 120 and 122.

Each bypass path consists of an inverter and a transistor connected in series between two nodes of the outer ring. For example, bypass path 122 includes inverter 130 and transistor 131. The transistor of the bypass path is controlled by the same voltage (VC) that is supplied to the inverters. When this voltage is low (which would result in a lower frequency in a simple VCO,) the conductance of the transistor is low, so the bypass path has little or no effect. The VCO output therefore oscillates at essentially the same frequency as a simple VCO having the same outer ring of inverters. When the control voltage is high (which would result in a higher frequency in a simple VCO,) the conductance of the transistor is high. Consequently, the signal is passed through the bypass path, effectively shortening the loop which is traversed by the signal and increasing the frequency of oscillation. The VCO output signal therefore oscillates at a higher frequency, similar to a simple VCO having a smaller number of inverters in the outer ring.

It should be noted that references herein to bypass paths or other circuitry being enabled or disabled (e.g., by applying high or low VC signals to transistors in the circuitry) are not intended to imply that the circuitry is always in a completely enabled or disabled state. It should be understood that the circuitry may be enabled or disabled in varying degrees, so that the circuitry produces varying amounts of conductance and thereby has more or less impact on signals with which its output is combined.

The conventional interpolative VCO of FIG. 1 increases the range of frequencies that can be generated by the VCO by selectively operating to effectively shorten the ring of inverters which must be traversed by the VCO output signal, and thereby increasing the maximum frequency of the signal. The embodiments of the present invention, on the other hand, increase the range of frequencies that can be generated by adding to the conventional structure a mechanism for selectively slowing down the signal as it traverses the outer ring of inverters.

It should be noted that, while the examples described herein (both prior art and embodiments of the present invention) use an outer ring that includes five inverters, other embodiments may use a different number of inverters (e.g., 5, 7, . . . ) It should also be noted that, while the bypass paths described herein are coupled to the outer ring so that three inverters of the outer ring are bypassed by a single inverter of each bypass path, other embodiments may bypass different numbers of inverters in the outer ring.

Figure 2:
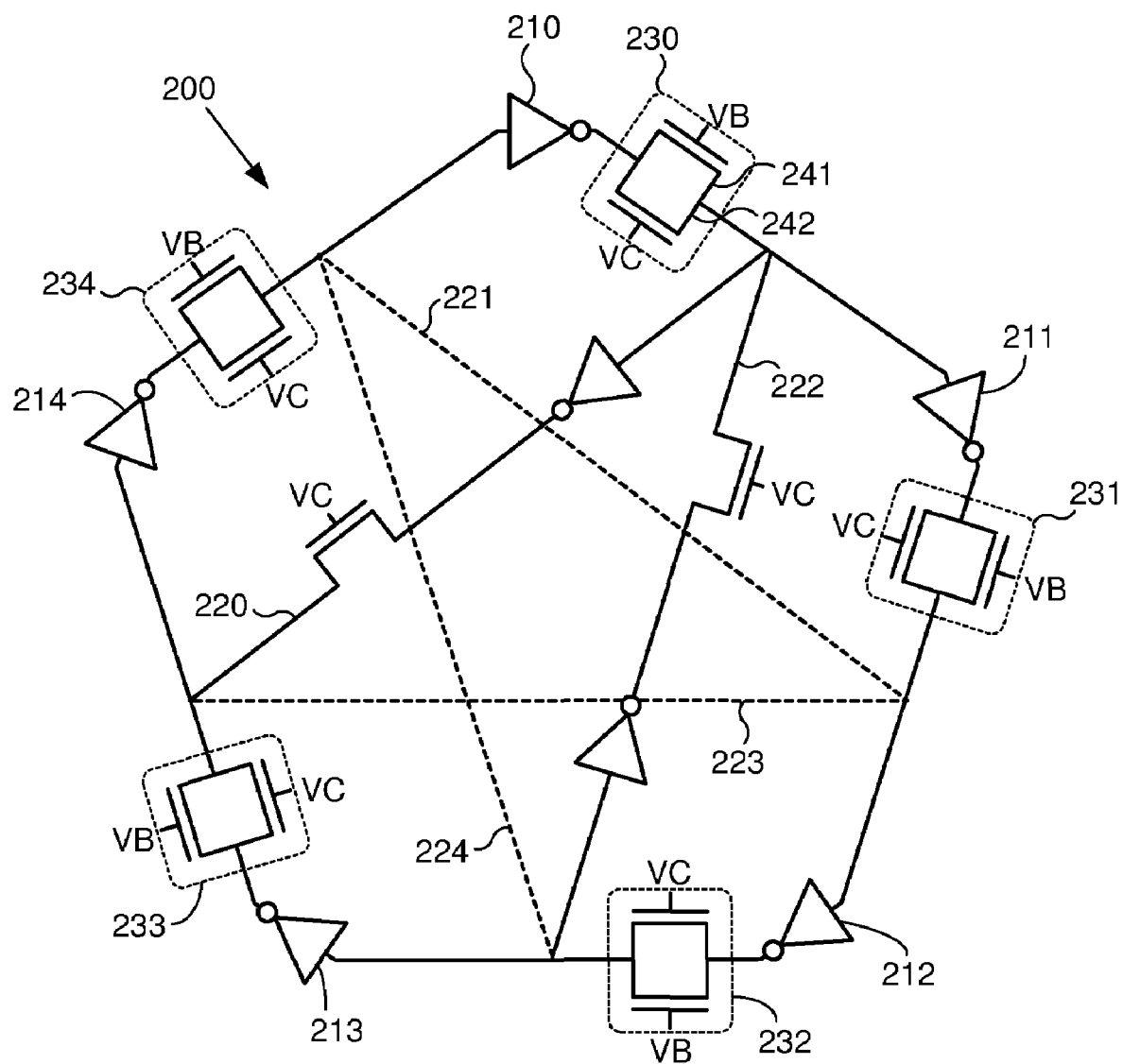
FIG. 2 is a diagram illustrating an interpolative VCO in accordance with one embodiment of the invention.

Referring to FIG. 2, a diagram showing an interpolative VCO in accordance with one embodiment is shown. VCO 200 includes a series of inverters 210-214 that are arranged in an outer ring similar to the structure of FIG. 1. VCO 200 also includes a set of bypass paths 220-224 that are connected to the nodes at the inputs of inverters 210-214, as in the structure of FIG. 1.

The structure of VCO 200 and differs from the structure of conventional interpolative VCO's in that inverters 210-214 are not directly connected to each other, but are instead connected to each other via corresponding variable delay units 230-234. That is, the output of each inverter is passed through a corresponding one of the variable delay units before being provided to the input of the next inverter in the ring. Each variable delay unit provides a selectable amount of conductance which can serve to slow down the transitions of the signals between high and low voltages at the inputs of the inverters and consequently cause the rate at which the signal oscillates to be reduced.

In the embodiment of FIG. 2, each variable delay unit consists of a pair of transistors. Each variable delay unit is substantially identically configured (i.e., it has the same components as the other variable delay units.) For example, in this embodiment, each variable delay unit (e.g., 230) consists of a high-impedance NMOS transistor (e.g., 241) and a low-impedance NMOS transistor (e.g., 242.) A first control signal (VB) is applied to the gate of the high-impedance transistor (e.g., 241,) and a second control signal (VC) is applied to the gate of the low-impedance transistor. In this embodiment, VC is the same control voltage that is applied to the outer ring of inverters, as well as to the transistors (e.g., 250) of the bypass paths (e.g., 222.) VB is a separate signal in this embodiment and is selectively generated to control the conductance of the high-impedance transistors.

In the embodiment of FIG. 2, when VC is high, each of the bypass paths (220-224) is active, so the VCO operates using the effectively shortened inverter loops. As explained above, this increases the frequency of the VCO output signal in comparison to a simple VCO without bypass paths. In this situation, it is desirable to minimize the effect of the variable delay unit, so VC is also applied to the low-impedance transistor (e.g., 242.) Thus, when VC is high, the low-impedance transistor is switched on, increasing its conductance and effectively bypassing the high-impedance transistor (e.g., 241.) The output of VCO 200 therefore oscillates at its maximum frequency. This frequency may be reduced somewhat from the maximum frequency of a similar conventional VCO (e.g., 100) because of the added components of the variable delay unit.

When VC is low, the transistors of the bypass paths are switched off so that the bypass paths are inactive. The VCO therefore operates using the entire series of inverters (210-214) in the outer ring. In a simple VCO, the low control voltage (VC) causes the VCO output signal to oscillate at its minimum frequency. In the VCO of FIG. 2, the low VC voltage switches off the low-impedance transistor (e.g., 242,) so that current flowing from one inverter to the next in the outer ring must flow through the corresponding high-impedance transistor (e.g., 241.) The lower the conductance of this transistor, the slower the voltage at the input of the subsequent inverter in the ring will change, and the lower the frequency of oscillation of the VCO output signal.

Figure 3:
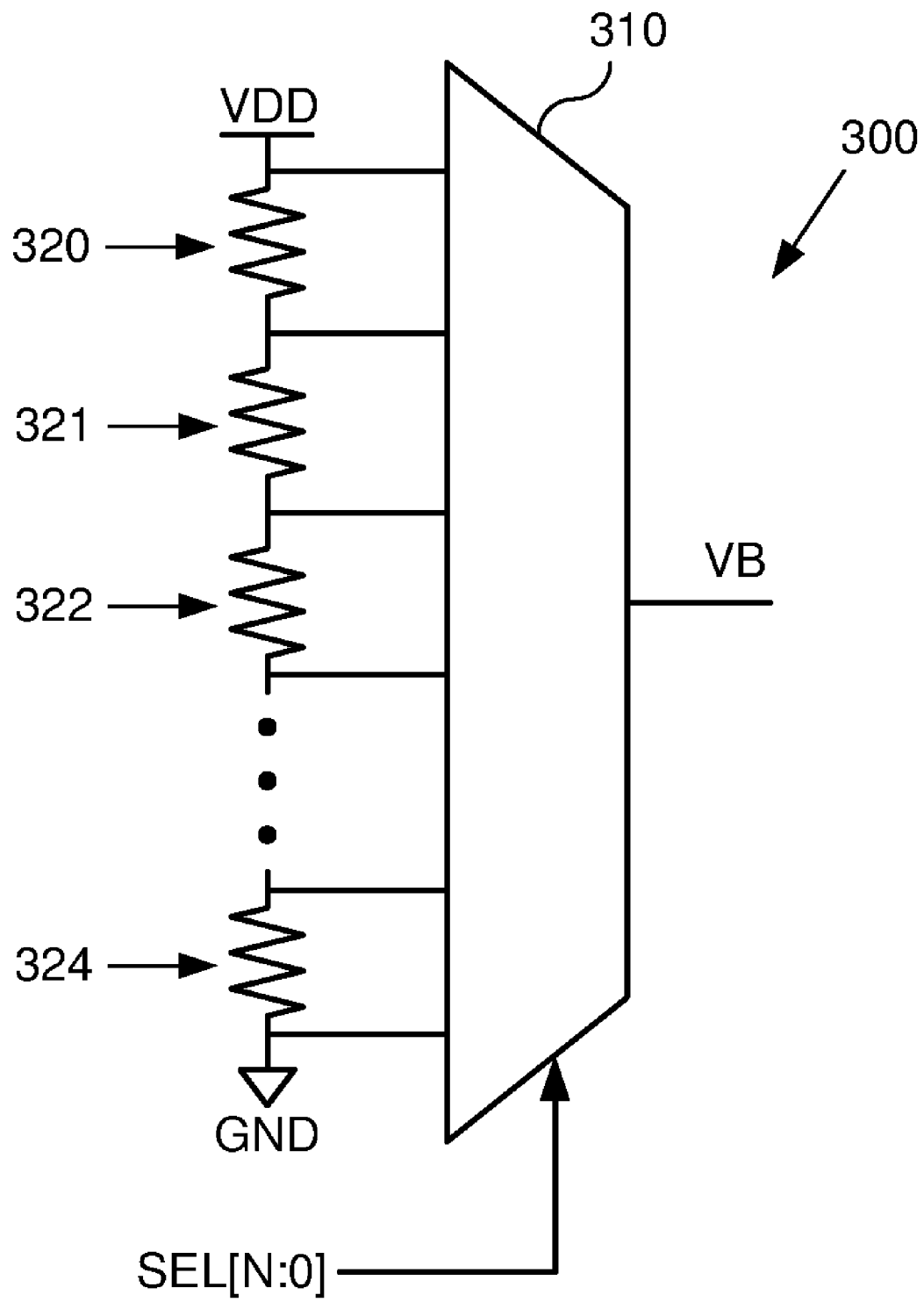
FIG. 3 is a diagram illustrating a bias voltage generator suitable for use in an interpolative VCO in accordance with one embodiment of the invention.

The conductance of the high-impedance transistor (e.g., 241) depends on control voltage VB, which may also be referred to as a bias voltage. The bias voltage may be generated in a variety of ways. In one embodiment, the bias voltage is generated by circuitry as illustrated in FIG. 3. Bias voltage generator 300 includes a multiplexer 310 and a series of resistors 320-324. While only for resistors are depicted in the figure, any number of resistors may be used. Similarly, while each of resistors 320-324 has the same resistance value, the resistors need not be identical.

Resistors 320-324 are connected in series between a supply voltage (VDD) and ground to form a voltage divider. Taps are provided at the nodes between resistors, as well as at VDD and ground. These taps are provided as inputs to multiplexer 310. Because resistors 320-324 are identical, the voltages provided to multiplexer 310 are stepped from 0 to VDD. For example, if there are N resistors, the voltages input to multiplexer 310 will be 0, 1/N VDD, 2/N VDD, ... (N−1)/N VDD, and VDD. A select signal (SEL[N:0]) is also input to multiplexer 310 to control the selection of one of these voltages to be output as VB.

It should be noted that the high-impedance transistors of the variable delay units in this embodiment may be replaced in alternative embodiments by other components (delay components) which would serve to delay the signal transitions produced at the inputs of the following inverters. For example, one alternative embodiment might use a resistor in place of the high-impedance transistor. Other embodiments could use other types of delay components.

Figure 4:
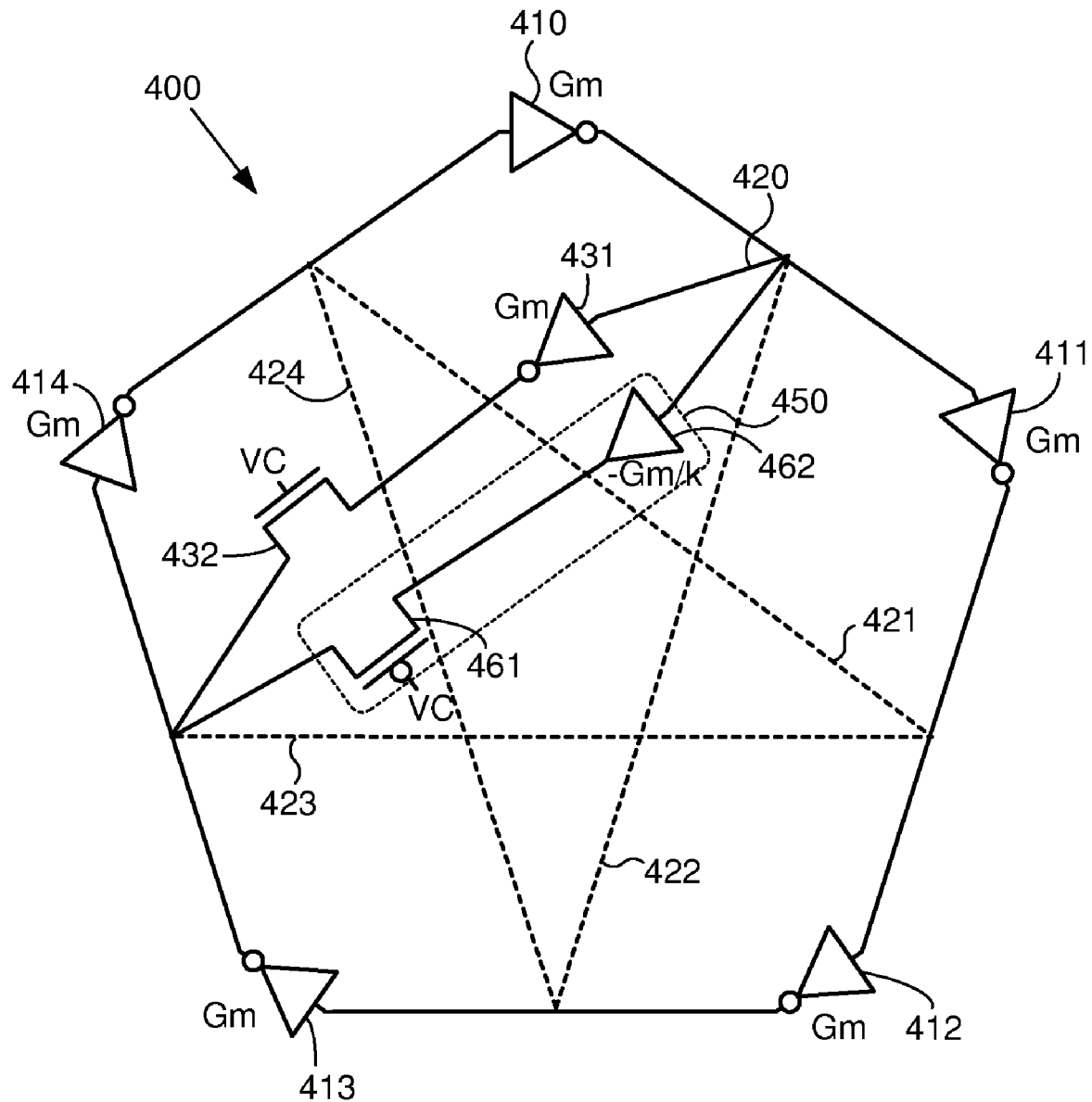
FIG. 4 is a diagram illustrating an interpolative VCO in accordance with an alternative embodiment of the invention.

Another embodiment of a VCO containing variable delay units is illustrated in FIG. 4. In this embodiment, VCO 400 again includes an outer ring of inverters and a set of bypass paths similar to the conventional VCO of FIG. 1. VCO 400 also includes a set of variable delay units that are connected to the outer ring of inverters in parallel with the bypass paths. The combined bypass and variable delay circuitry produces a gain that may either be positive (thereby increasing the frequency of oscillation as in a conventional interpolative VCO) or negative (thereby increasing the frequency of oscillation.)

Referring to FIG. 4, the outer ring of VCO 400 includes inverters 410-414, which are connected in a circular series similar to the other VCO structures. VCO 400 also includes a set of bypass paths 420-424 which are connected between the nodes of the outer ring to form inner loops in the VCO. Each bypass path consists of a transistor (e.g., 431) connected in series with an inverter (e.g., 432.) The transistor is controlled by VC, so that the bypass path is enabled when VC is high to increase the frequency of oscillation, and disabled when VC is low.

As noted above, the variable delay units in this embodiment are not positioned between the inverters of the outer ring, but are instead positioned in parallel with the bypass paths. There is a variable delay unit corresponding to each of the bypass paths. For purposes of clarity, only one of the variable delay units (450) is explicitly depicted in the figure. In this figure, each dotted line between a pair of the outer ring's nodes represents a bypass path and corresponding variable delay unit.

As is shown in FIG. 4, each variable delay unit (e.g., 450) consists of a transistor (e.g., 461) and a buffer (e.g., 462.) Because variable delay unit 450 employs a buffer instead of an inverter, the signal passing through variable delay unit 450 is inverted with respect to the signal passing through bypass path 420. The effect of each signal is controlled by the corresponding transistor (432 for the bypass path, and 461 for the variable delay unit.)

Transistor 461, like transistor 432, is controlled by VC. Transistor 461, however, is a PMOS transistor which is switched on when VC is low. Transistor 432, on the other hand, is an NMOS transistor which is switched off when VC is low. Thus, when VC is high, the effect of bypass path 420 dominates, and when VC is low, the effect of variable delay unit 450 dominates.

If the bypass paths are considered to have a positive gain (with a maximum magnitude of Gm,) the variable delay units can be considered to have a negative gain (here, with a maximum magnitude of Gm/k). As the control voltage (VC) is varied, the combined gain of each bypass path and the corresponding variable delay unit ranges from +Gm to −Gm/k. When VC is high, the gain is high (e.g., +Gm,) and the frequency of oscillation of the VCO is high. When VC is low, the gain is low (e.g., −Gm/k,) and the frequency of oscillation of the VCO is low. (It should be noted that, while k could have a wide range of values, simulated results were best for k>1.)

Figure 5:
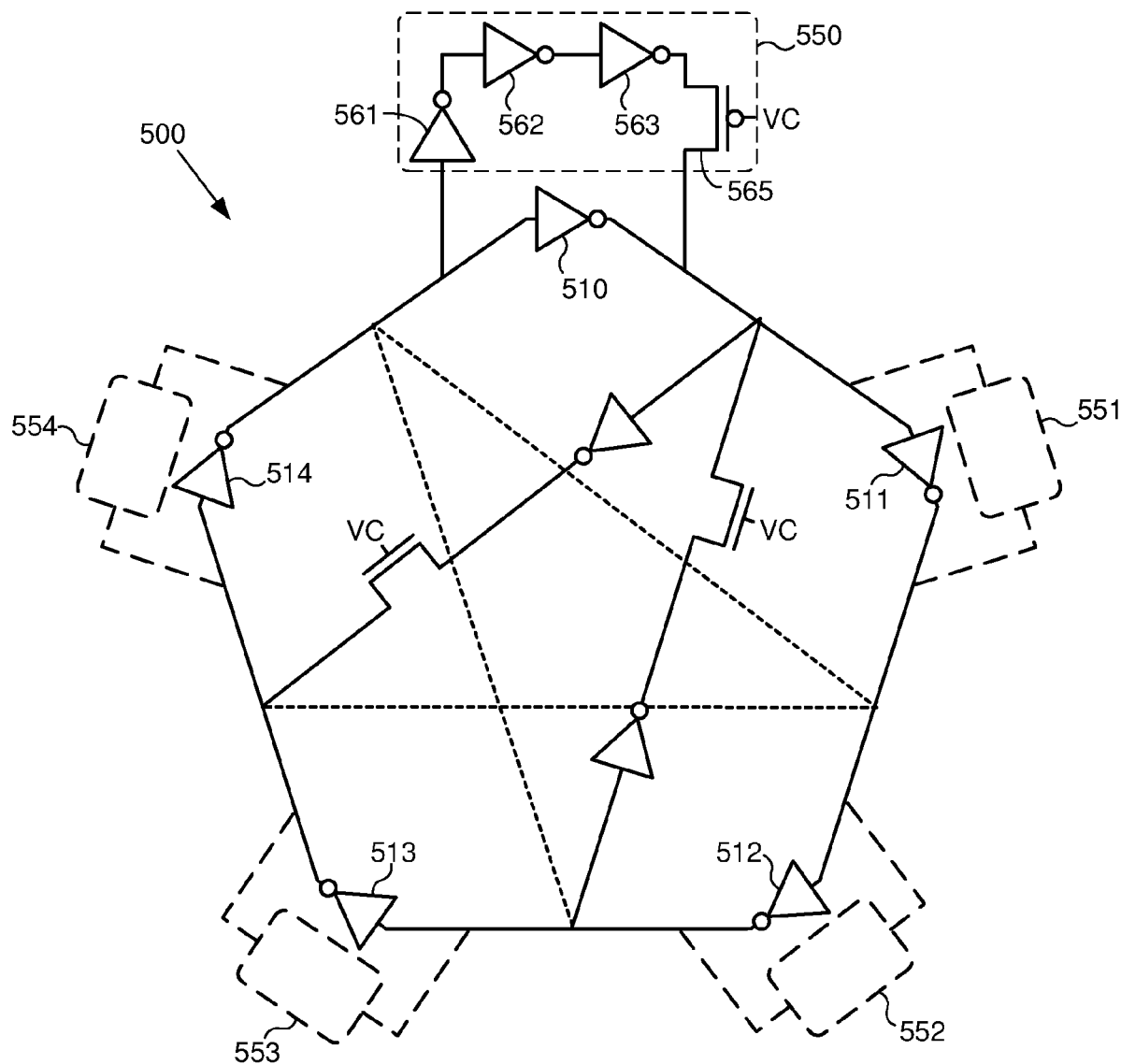
FIG. 5 is a diagram illustrating an interpolative VCO in accordance with another alternative embodiment of the invention.

Referring to FIG. 5, another alternative embodiment is illustrated. This VCO again makes use of a serially connected ring of inverters with a set of bypass paths as found in conventional interpolative VCO's. In this embodiment, the variable delay units are not positioned in parallel with the bypass paths, but are instead used to form an alternative path around each of the inverters in the outer ring. In other words, the signal path of the variable delay unit originates at the input to a corresponding one of the inverters and terminates at the output of this inverter. The time required to traverse the signal path of the variable delay unit is greater than the time required for a signal to propagate through the inverter, so the variable delay unit slows the signal transitions at the output of the inverter.

As shown in FIG. 5, VCO 500 includes inverters 510-514, which are connected in series, end-to-end, to form a ring. VCO 500 also includes bypass paths 520-524, which are connected between the nodes of the ring (i.e., between the interconnections of the inverters in the ring) as in a conventional VCO. Finally, VCO 500 includes a set of variable delay units 550-554. Each of the variable delay units is connected to the outer ring in parallel with a corresponding one of the inverters. For example, variable delay unit 550 is connected to the ring in parallel with inverter 510.

Each variable delay unit in this embodiment includes an odd number of inverters, such as the three inverters 561-563. These inverters are connected in series. A transistor 565 is also connected in series with inverters 561-563. The signal path formed by variable delay unit 550 has an input end which is connected to the input of inverter 510, and an output end which is connected to the output of inverter 510. It should be noted that, in alternative embodiments, different numbers of inverters could be used, or the inverter(s) could be used in combination with one or more delay elements to slow the signal transitions.

Transistor 565 is a PMOS transistor. The control voltage VC is applied to the gate of transistor 565 to control the amount of current that flows through the variable delay unit. Because transistor 565 is a PMOS transistor, it is switched off when VC is high and switched on when VC is low. Consequently, variable delay unit 550 has less impact when VC is high and higher oscillation frequencies are generated. When VC is low, and lower oscillation frequencies are normally generated by the outer ring of inverters, transistor 565 is switched on so that the variable delay unit has more impact on the signal at the node between inverters 510 and 511. Because the signal produced by variable delay unit 550 is delayed with respect to the signal produced by inverter 510, the signal transition at the input of inverter 511 is delayed more than it would be in the absence of variable delay unit 550. Consequently, the frequency of oscillation of VCO 500 is lower than a comparable VCO without variable delay units.

Figure 7:
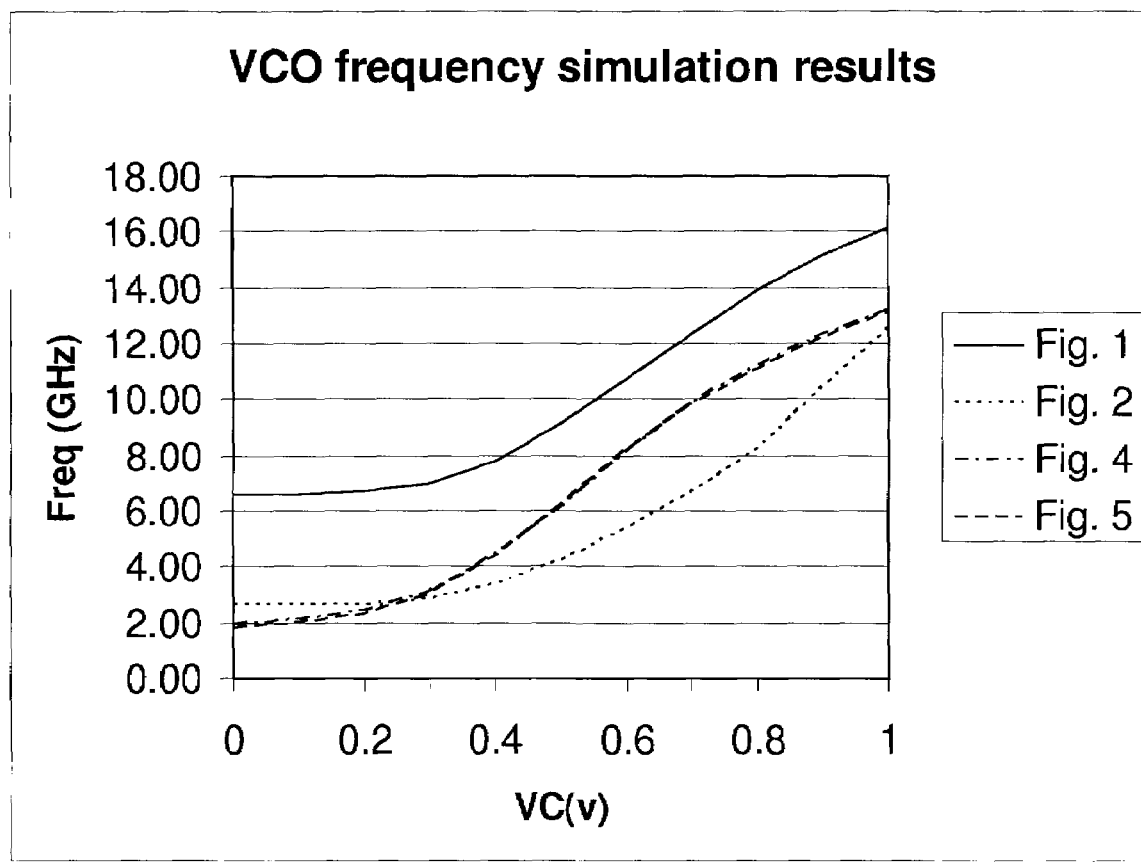
FIG. 7 is a graph of the data contained in the table of FIG. 6.

As previously noted, the interpolative VCO's described above can produce a much wider range of frequencies than is possible using conventional designs. This is illustrated in FIGS. 6 and 7. These figures show the results of simulations of various interpolative VCO structures. FIG. 6 is a table showing the oscillation frequency of each of the described VCO structures as a function of the control voltage, VC. FIG. 7 is a graph of the data contained in the table of FIG. 6.

FIG. 6 includes a column for each of FIGS. 1, 2, 4 and 5. As noted above, FIG. 1 illustrates a conventional, prior art interpolative VCO structure. FIGS. 2, 4 and 5 illustrate three different embodiments of the present interpolative VCO. It can be seen that the conventional VCO structure can generate frequencies ranging from 6.62 GHz (at VC=0) to 16.13 GHz (at VC=1.) The VCO's of FIGS. 2, 4 and 5, on the other hand, can produce frequencies that vary from 2.65 GHz to 12.5 GHz, 1.92 GHz to 13.16 GHz, and 1.77 GHz to 13.13 GHz, respectively. As pointed out above, FIG. 7 graphically illustrates the ranges of frequencies that can be achieved by each of the VCO designs.

While the conventional interpolative VCO structure has a higher maximum frequency of oscillation than the present systems, it also has a substantially higher minimum frequency of oscillation. The range of frequencies for the conventional structure, defined by the maximum frequency divided by the minimum frequency, is therefore 2.44. The ranges of oscillation frequencies for the VCO structures of FIGS. 2, 4 and 5 are 4.73, 6.87 and 7.42, respectively. These ranges are obviously much wider than the range of the conventional design.

Those of skill in the art will understand that information and signals may be represented using any of a variety of different technologies and techniques. For example, data, information, signals, etc. that may be referenced throughout the above description may be represented by voltages, currents, electromagnetic waves, or the like.

The various illustrative logical blocks, modules, and circuits described in connection with the embodiments disclosed herein may be implemented or performed with application specific integrated circuits (ASICs), field programmable gate arrays (FPGAs) or other programmable logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A voltage controlled oscillator (VCO) comprising:
   a ring of serially connected inverters;
   a plurality of bypass circuits coupled to the ring of serially connected inverters,
     wherein the bypass circuits are configured to be selectively enabled,
     wherein each bypass circuit is configured to bypass one or more of the serially connected inverters when the bypass circuit is enabled; and
   a plurality of variable delay units,
     wherein each variable delay unit is configured to delay, by a variable amount, signal transitions at an input of a corresponding one of the serially connected inverters,
     wherein each variable delay unit is coupled between a successive pair of the serially connected inverters, with an input of the variable delay unit coupled to an output of one of the successive pair of the serially connected inverters and an output of the variable delay unit coupled to an input of the other one of the successive pair of the serially connected inverters,
     wherein each variable delay unit is configured to be selectively enabled, and
     wherein each variable delay unit is configured to provide a variable conductance between the successive pair of the serially connected inverters,
     wherein each variable delay unit includes a first transistor, and
     wherein a control voltage VC is applied to a gate of the first transistor, wherein a maximum oscillation frequency of the VCO divided by a minimum oscillation frequency of the VCO is greater than or equal to 4.72 with the control voltage VC between 0v and 1v.

2. The VCO of claim 1, wherein each variable delay unit includes a a delay component, wherein the first transistor and the delay component are coupled in parallel between an input of the variable delay unit and an output of the variable delay unit.

3. The VCO of claim 2, wherein the delay component comprises a second transistor, wherein a bias voltage VB is applied to a gate of the second transistor.

4. The VCO of claim 3, wherein the first transistor comprises a low-impedance transistor and the second transistor comprises a high-impedance transistor.

5. The VCO of claim 3, wherein the variable delay unit further comprises a bias voltage generator configured to produce a selectable bias voltage.

6. The VCO of claim 5, wherein the bias voltage generator comprises a multiplexer, wherein a plurality of different voltages are input to the multiplexer, and wherein a bias control signal is applied to a control input of the multiplexer to select one of the plurality of input voltages and to output the selected input voltage as the bias voltage.

7. The VCO of claim 2, wherein the delay component comprises a resistor.

8. A voltage controlled oscillator (VCO) comprising:
   a ring of serially connected inverters;
   a plurality of bypass circuits coupled to the ring of serially connected inverters,
     wherein the bypass circuits are configured to be selectively enabled, and
     wherein each bypass circuit is configured to bypass one or more of the serially connected inverters when the bypass circuit is enabled; and
   a plurality of variable delay units,
     wherein each variable delay unit is configured to delay, by a variable amount, signal transitions at an input of a corresponding one of the serially connected inverters,
     wherein each variable delay unit is coupled to the ring of serially connected inverters in parallel with a corresponding one of the bypass circuits, with an input of the variable delay unit coupled to an input of the corresponding one of the bypass circuits and an output of the variable delay unit coupled to an output of the corresponding one of the bypass circuits,
     wherein the variable delay unit has a gain which is opposite a gain of the corresponding bypass circuit,
     wherein each variable delay unit includes a first transistor, and
     wherein a control voltage VC is applied to a gate of the first transistor, wherein a maximum oscillation frequency of the VCO divided by a minimum oscillation frequency of the VCO is greater than or eaual to 4.72 with the control voltage VC between 0v and 1v.

9. The VCO of claim 8, wherein the variable delay unit comprises a buffer coupled in series with the first transistor.

10. The VCO of claim 9, wherein the bypass circuit comprises an inverter and wherein the gain of the buffer is opposite the gain of the inverter.

11. The VCO of claim 10, wherein the bypass circuit further comprises a second transistor coupled in series with the inverter, and wherein the first and second transistors are controlled so that the conductance of the second transistor is increased when the conductance of the first transistor is decreased, and decreased when the conductance of the first transistor is increased.

12. The VCO of claim 11, wherein one of the first and second transistors is a PMOS transistor and the other of the first and second transistors is an NMOS transistor, and wherein the control voltage VC is applied to a gate of the second, transistor.

13. A voltage controlled oscillator (VCO) comprising:
    a ring of serially connected inverters;
    a plurality of bypass circuits coupled to the ring of serially connected inverters,
      wherein the bypass circuits are configured to be selectively enabled, and
      wherein each bypass circuit is configured to bypass one or more of the serially connected inverters when the bypass circuit is enabled; and a plurality of variable delay units,
   wherein each variable delay unit is configured to delay, by a variable amount, signal transitions at an input of a corresponding one of the serially connected inverters,
   wherein each variable delay unit is coupled in parallel to one of the serially connected inverters with an input of the variable delay unit coupled to an input of the inverter and an output of the variable delay unit coupled to an output of the inverter,
   wherein each variable delay unit is configured to be selectively enabled, and
   wherein each variable delay unit is configured to delay a signal input to the variable delay unit by an amount greater than an amount by which the signal is delayed by the inverter,
   wherein each variable delay unit includes a delay unit transistor, and
   wherein a control voltaqe VC is applied to a qate of the delay unit transistor, wherein a maximum oscillation frequency of the VCO divided by a minimum oscillation frequency of the VCO is greater than or equal to 4.72 with the control voltaqe VC between 0v and 1v.

14. The VCO of claim 13, wherein each variable delay unit comprises a plurality of inverters which are serially connected between the input and output of the variable delay unit and are serially connected with the delay unit transistor.

15. The VCO of claim 14, wherein each bypass circuit comprises an inverter in series with a bypass transistor and wherein the delay unit and bypass transistors are controlled so that the conductance of the delay unit transistor is increased when the conductance of the bypass transistor is decreased, and decreased when the conductance of the bypass transistor is increased.

16. The VCO of claim 13, wherein each variable delay unit comprises at least one inverter which is serially connected with the delay unit transistor and one or more delay components which are serially connected between the input and output of the variable delay unit.

* * * * *